US007982547B2

(12) United States Patent
Herzinger

(10) Patent No.: US 7,982,547 B2
(45) Date of Patent: Jul. 19, 2011

(54) PHASE LOCKED LOOP-BASED TUNING ADJUSTABLE FILTER

(75) Inventor: Stefan Herzinger, Sauerlach (DE)

(73) Assignee: Infineon Technologies AG, Neubiberg (DE)

(*) Notice: Subject to any disclaimer, the term of this patent is extended or adjusted under 35 U.S.C. 154(b) by 63 days.

(21) Appl. No.: 12/414,575

(22) Filed: Mar. 30, 2009

(65) Prior Publication Data

US 2010/0244944 A1    Sep. 30, 2010

(51) Int. Cl.
  *H03L 7/24*    (2006.01)
(52) U.S. Cl. .......... 331/47; 331/2; 331/17; 331/46; 375/344; 375/345; 455/307

(58) Field of Classification Search ............... 331/44, 331/182, 2, 46, 48, 50, 54, 56; 455/150.1, 455/307, 313, 323; 375/317, 340, 344, 345
See application file for complete search history.

(56) References Cited

U.S. PATENT DOCUMENTS

| | | | | |
|---|---|---|---|---|
| 3,969,678 | A * | 7/1976 | Asahara et al. | 327/557 |
| 5,339,455 | A * | 8/1994 | Vogt et al. | 455/266 |
| 6,813,484 | B1 * | 11/2004 | Tolson | 455/307 |
| 7,039,385 | B1 * | 5/2006 | Hoffmann et al. | 455/340 |
| 7,308,241 | B2 * | 12/2007 | Shimada et al. | 455/307 |
| 2003/0017817 | A1 * | 1/2003 | Cowley | 455/323 |
| 2005/0232080 | A1 * | 10/2005 | Tolciu | 367/99 |
| 2009/0325521 | A1 * | 12/2009 | Dubash et al. | 455/150.1 |

* cited by examiner

*Primary Examiner* — Joseph Chang
*Assistant Examiner* — Jeffrey Shin
(74) *Attorney, Agent, or Firm* — Lee & Hayes, PLLC

(57) ABSTRACT

Phase locked loop based frequency tuning of an adjustable filter is disclosed. A resonant circuit includes the adjustable filter, and an oscillator signal provides an input to the resonant circuit.

18 Claims, 6 Drawing Sheets

US 7,982,547 B2

PHASE LOCKED LOOP-BASED TUNING ADJUSTABLE FILTER

BACKGROUND

Filters are typically used in transceivers to filter an incoming signal. Increasing large scale integration in the field of RF transceivers and the like results in the need to realize highly selective filters on the semiconductor. The filters ("enhanced-Q filters") are typically formed from one or more resonant circuits, the quality factor of which is increased by active circuits in order to achieve the necessary selection of the RF frequency to be filtered. Increasing the quality factor results in instability of the frequency tuning of the filters, since enhanced-Q filters must have a reception frequency tuning accurately or a transmission frequency tuning accurately of less than 1% in order to acceptably filter the incoming RF signal.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION OF THE INVENTION

One approach to increase the filter quality factor without resulting in instability of the frequency when tuning a filter circuit is to de-attenuate the filter. By increasingly de-attenuating the filter, a natural oscillation builds up in the filter circuit. Subsequently, oscillations within the filter can be measured e.g. by a frequency counter or a frequency detector. By using the oscillation measurement, iterative adjustment can be performed (e.g. by a successive approximation algorithm) to adjust the filter.

One major disadvantage of this approach is that a fundamental parameter of the filter (e.g. the quality factor) is set in a manner significantly deviating from the actual filter operation. This approach leads to a considerable frequency deviation between filter operation and natural oscillation mode and often results in an increase in filter current consumption. Generally, for all the important properties (noise, linearity), circuit performance expectations have to be lowered as it is necessary to make a compromise between the two modes of filter operation (a filter operation mode and an oscillation mode for adjustment).

Figure 1:
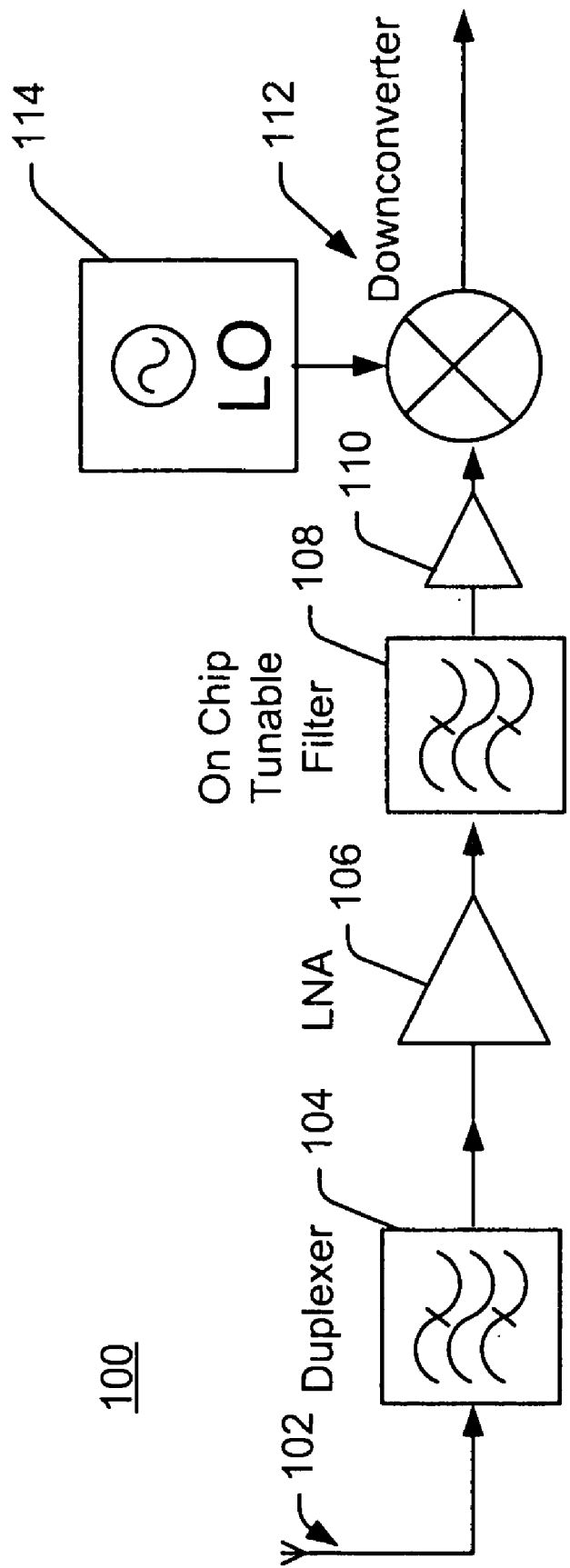
FIG. 1 is a simplified schematic diagram of a system for receiving and filtering an incoming signal.

Referring to the figures, wherein like numerals indicate corresponding parts throughout the several views, illustrated in FIG. 1 is one such approach that increases the filter's quality factor without resulting in instability of the frequency tuning of the filter. Exemplary system 100 is shown having an antenna 102 that receives an incoming RF signal. The RF signal is fed via a duplexer 104 and a low noise amplifier 106 to an on-chip tunable filter 108, which may be on the same chip as amplifier 110 and down converter 112. The tunable filter 108 filters the RF signal that is then fed via amplifier 110 to down converter 112. The down converter 112 is configured to receive an oscillation signal from local oscillator circuit 114. Down converter 112, using the oscillation signal, transforms the filtered RF signal into a down converted signal that is then fed to other circuitry (not shown) in the system 100.

An adjustment is made to the tunable filter 108 to maximize the amplitude of the filtered RF signal. The tunable filter 108 is adjusted iteratively, so that the maximum amplitude of the signal being output from filter 108 is tuned to the desired frequency.

Figure 2:
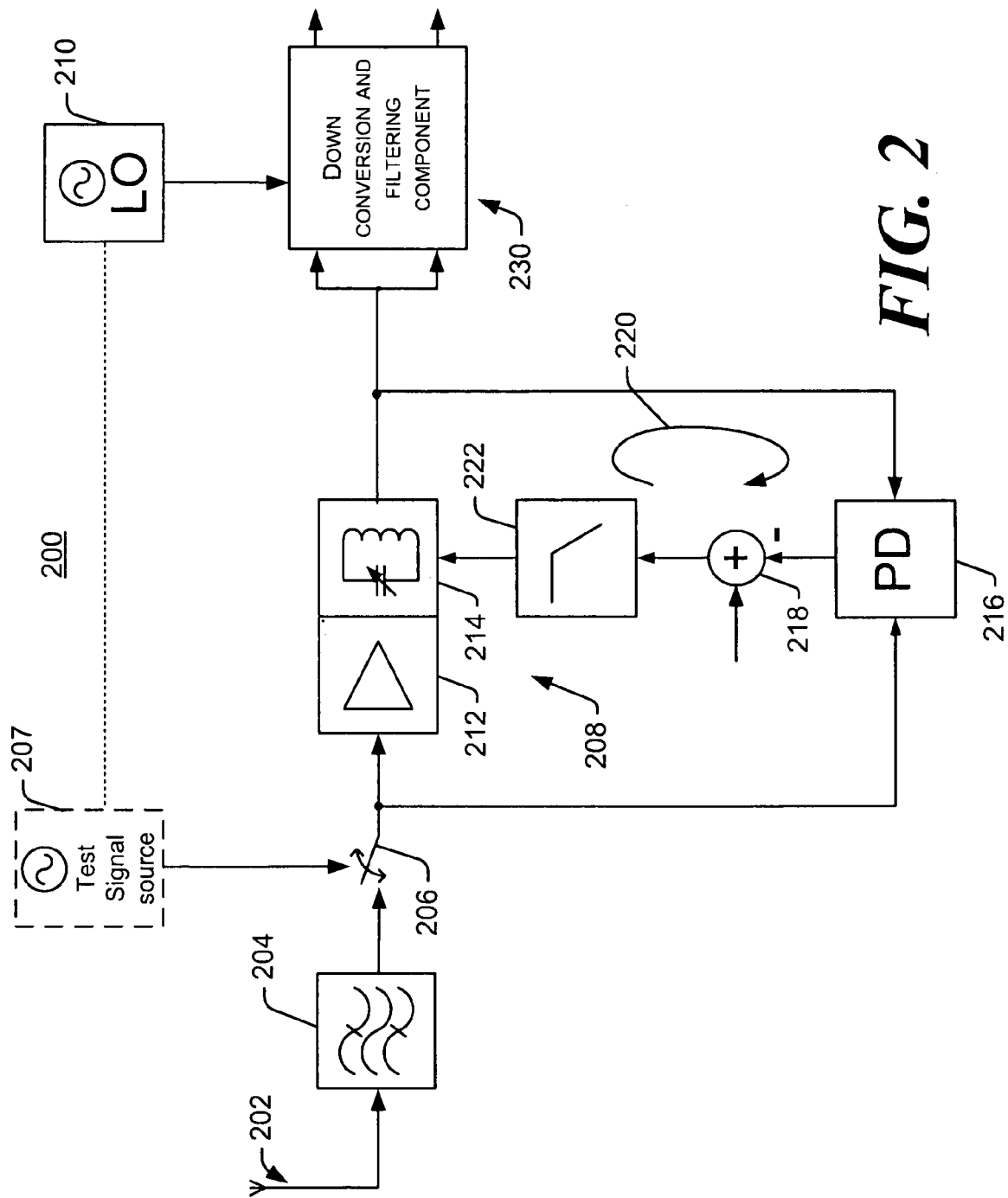
FIG. 2 is a simplified schematic diagram of a system for phase locked loop-based tuning of an adjustable filter.

FIG. 2 illustrates one implementation of a system 200 for phase locked loop based frequency tuning of an adjustable filter, which may be tuned using digital or analog based tuning components to achieve a desired phase, frequency, and/or amplitude. Exemplary system 200 is shown having an antenna 202 that receives, for example, an incoming RF signal, though the system may also be used as part of a transmitter or transceiver circuit and may operate at a radio frequency, intermediate frequency, or other suitable frequency. The RF signal is fed via a duplex filter 204 to a switch 206. The switch 206, which may be implemented as part of an adder circuit is configured to receive a reference or test signal such as a sine wave signal. The test signal may originate from a test signal source 207, or it may be generated by a local oscillator (LO), such as LO 210, which may be located downstream of the adder circuit 206. The dashed and dotted lines highlight that the test signal source 207 and the signal generated from the LO 210 are alternate options. The test signal may be set to a desired reference value for adjusting or tuning one or more components of the system 200. The desired reference value may have a center frequency that is based upon a desired center frequency for the signal received from the antenna 202.

The test signal is fed to a circuit 208, such as a resonance circuit, which includes an amplifier 212 and an adjustable filter 214, which may be a so-called LC tank reactance filter with adjustable capacitance. The test signal is also fed to a phase detector 216, which detects the test signal (i.e., the input to the circuit 208) and the signal output by the circuit 208. The phase detector 216 outputs a signal (e.g. a tuning voltage in the case of an analog phase detector or digitally coded information in the case of a time to digital converter (TDC)) that represents the phase difference detected at the phase detector 216. The circuit 208 may be configured to have a zero phase at its resonant frequency. The signal output by the phase detector 216 is provided to a phase adjustment component, such as adder circuit 218, which compares the signal to a phase desired value or set point value. The phase desired value may be selected to accommodate, for example, an offset phase in the amplifier 212. If the circuit 208 or the amplifier 212 has a phase, phase offset, or transfer phase of 0°, the effective phase desired value is set to 0 or the adder is omitted from the circuit. The adder circuit 218, as part of a phase locked loop (PLL) circuit 220, adjusts the phase difference signal based on a phase offset characteristic of the amplifier or the circuit and provides the adjusted phase difference signal to a loop filter 222, which may be a low-pass filter. The loop filter 222 filters the adjusted phase difference signal and generates a tuning signal having an adjustment value corresponding to the phase difference between the signal input to the circuit 208 and the signal output by the circuit 208.

The loop filter 222 sets an adjustable value, such as an adjustable capacitance, impedance or other suitable value, of the adjustable filter 214 or other component of circuit 208 based on the adjustment value of the tuning signal. In the case of an LC tank adjustable filter 214, a fewer or greater number of capacitors may be enabled to adjust the filter's operation characteristics. By adjusting the impedance or other adjustable characteristic of adjustable filter 214 (or other component of the circuit 208) such that the phase of the signal input to the circuit 208 matches the phase of the signal output from the circuit 208, the phase locked loop circuit 220 adjusts or tunes a phase, center frequency, and/or amplitude of the circuit 208 to the frequency of the test signal source 208 or the local oscillator 210. In response, the circuit 208 outputs a filtered output signal.

The PLL circuit 220 may be operated for a predetermined time or until it reaches a particular adjustment value. The PLL circuit 220 may then be opened and the adjustment value of the adjustable filter 214 stored, such as in an associated memory, logic circuit, or output register, as is well understood in the adjustable filter arts and, therefore not shown for the sake of simplicity. The adjustable filter 214 may be operated using the adjustment value once the PLL is opened and/or once the signals are received from antenna 202 and provided to the circuit 208. For example, once the adjustment value of adjustable filter is set, a signal (e.g. an RF communication signal) may be filtered by filter 204 and processed by the circuit 208 to provide a filtered output signal. The filtered output signal from the circuit 208 is fed to a down converting and filtering component 230. The down converting and filtering component 230 may be configured to receive RF, intermediate frequency, or other similar incoming signals as part of a receiver circuit. The down converting and filtering component 230 receives the oscillation signal from the local oscillator 210 and, using down converters, low pass filters, and/or other known components, processes incoming signals such as those received from antenna 202 and processed by circuit 208.

As mentioned above, and according to one implementation, the phase detector is realized as a TDC with the temporal spacing between two edges being digitized. Since the phase difference is proportional to the time difference, a TDC is functionally also a phase detector. The TDC implementation may be based on a delay chain composed of CMOS gates. When a TDC is used as the phase detector, the loop filter can be realized very efficiently as a digital filter. The filter design is affected, in principle, according to the following basic criteria with regard to control technology: the bandwidth of the control corresponding to the requirement made of the transient recovery time, and the stability of the control system under all conditions (e.g., phase margin). A factor that favors the digital implementation is the ease of retaining the adjustment value after the transient recovery process has taken place. For this purpose, the digital filter clocking may be deactivated after a fixed waiting time corresponding to the maximum transient recovery time. The adjustment value may then be retained in, for example, the output register of the loop filter.

According to one quantitative example, the system 200 is a UMTS receiver having a channel bandwidth of 5 MHz, and frequency characteristic of 2.2 GHz. An on-chip filter (e.g. filter 204) is utilized for suppressing the transmission signal ($f_{TX}$=2 GHz). This results in a required resonant circuit (e.g. circuit 208) quality factor of Q=30. A maximum amplitude ripple of 0.5 dB is permissible in the reception channel. This results in a tuning accuracy of approximately +−0.4%. On the basis of the transfer function of the resonant circuit, this can be reformulated into a phase difference: +−15°. The temporal resolution of the TDC (e.g. phase detector 216) may be of this order of magnitude or lower: $\Delta t$=15°/360°/2200 MHz=19 ps. The adjustment sought for the resonant circuit may be realized with a TDC resolution of the order of magnitude of 10 ps.

Exemplary Process

Specifics of exemplary methods are described below. However, it should be understood that certain acts need not be performed in the order described, and may be modified, and/or may be omitted entirely, depending on the circumstances. Moreover, the acts described may be carried out using a computer, processor or other computing device based on instructions stored on one or more computer-readable media. The computer-readable media can be any available media that can be accessed by a computing device to implement the instructions stored thereon.

Figure 3:
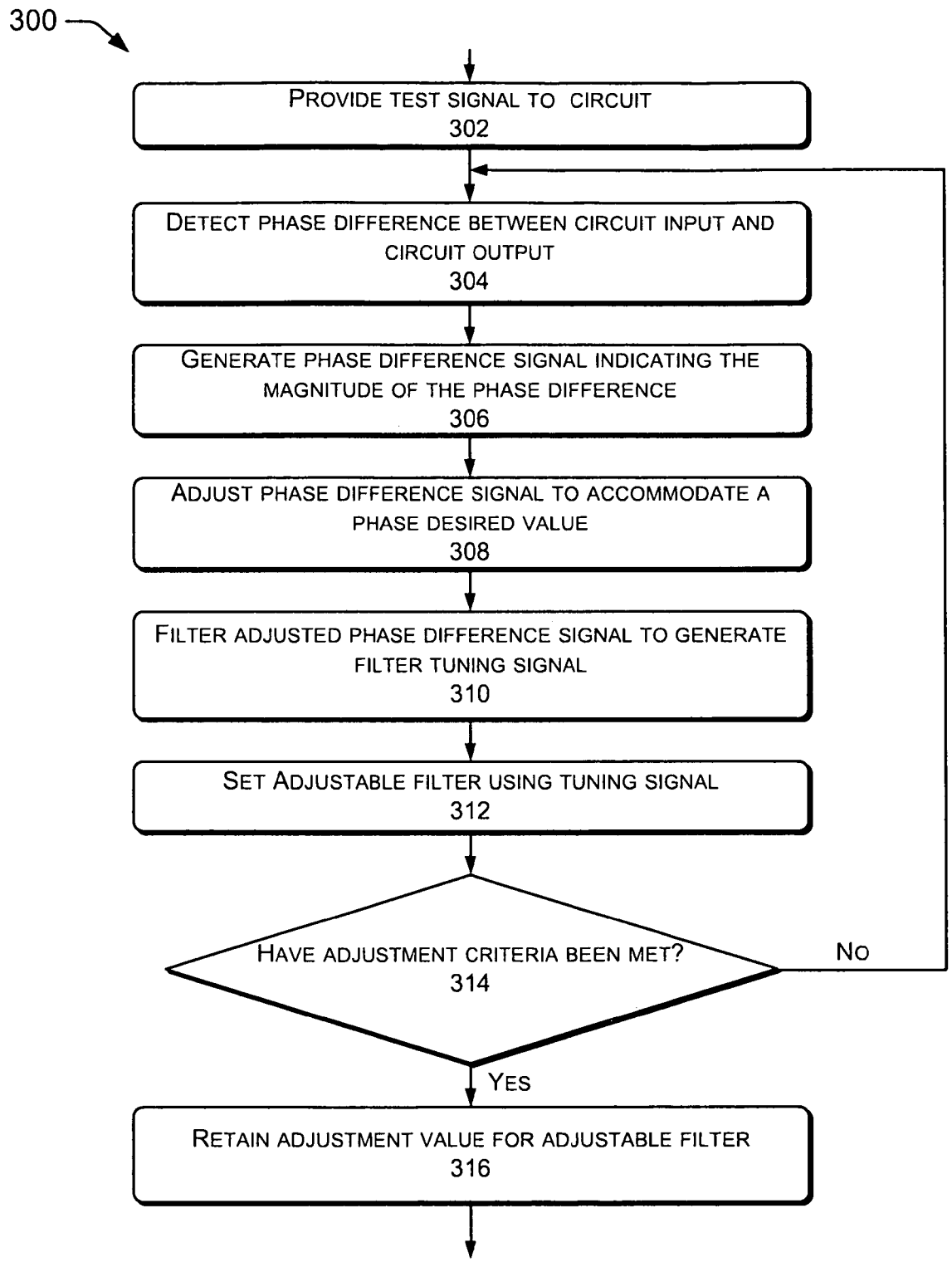
FIG. 3 is a flow diagram of a process for phase locked loop-based tuning of an adjustable filter.

FIG. 3 illustrates one example implementation of a process 300 for phase locked loop based frequency tuning of an adjustable filter 214 using the system 200 shown in FIG. 2.

At 302, a test signal is set, e.g., to a desired center frequency, to provide a reference for adjusting one or more components of the system 200. For example, the test signal may be provided to the circuit 208. The desired center frequency may be based upon a desired center frequency for the signal received from the antenna 202 or other desired frequency. The test signal may be applied when the system 200 is initialized (e.g. when a communications device is powered on, when the system is set into a state that is ready to receive a signal, or other suitable event).

At 304, a phase difference is detected between a center frequency of the test signal input into the circuit 208 and a center frequency of the signal output by the circuit 208.

At 306, a phase difference signal is generated that indicates the phase difference between the center frequency of the test signal input into the circuit 208 and the center frequency of the signal output by the circuit 208. The phase difference signal may be a digital or analog signal.

At 308, the phase difference signal is adjusted to accommodate a phase desired value, which may be selected to accommodate, for example, a phase offset, or phase transfer, in the amplifier 212. The phase difference signal adjustment may be performed using an adder circuit as described above.

At 310, the phase difference signal is filtered by a loop filter 222, such as a low-pass filter, to generate a tuning signal. The tuning signal is provided to the adjustable filter 214 in the circuit 208.

At 312, an adjustable characteristic, such as an adjustable capacitance or impedance of the filter 214 in the circuit 208, is set using the tuning signal. By adjusting the adjustable filter 214 in the circuit 208, such that the phase of the signal input to the circuit 208 matches the phase of the signal output from the circuit 208, the phase locked loop 220 adjusts a center frequency of the circuit 208 to the frequency of the test signal source 208 or the local oscillator 210. In response, the circuit 208 outputs a filtered output signal.

At 314, it is determined whether one or more adjustment criteria have been met. For example, it may be determined whether a certain set point for the adjustable filter has been reached. Alternatively, it may be determined whether a predetermined time has elapsed since the test signal was initially provided to the circuit. If the one or more criteria have not been met, the process returns to 304. If the one or more criteria have been met, the process proceeds to 316.

At 316, an adjustment value of the adjustable filter is retained at a fixed value. Thus, the adjustable filter 214 is adjusted or tuned for use in receiving signals, such as RF communication signals and providing them as filtered RF output signals.

Once the tuning process is complete, the system 200 may be operated in a normal fashion, e.g. to receive RF communication signals, process the signals using circuit 208 and feed the filtered RF output signals to the further processing components, such as down converter and filtering components 230, as described above. The circuit 208 or the adjustable filter 214 may not need to be re-tuned or re-adjusted unless desired by a user or prompted by operating conditions.

Alternative Exemplary Systems

Figure 4:
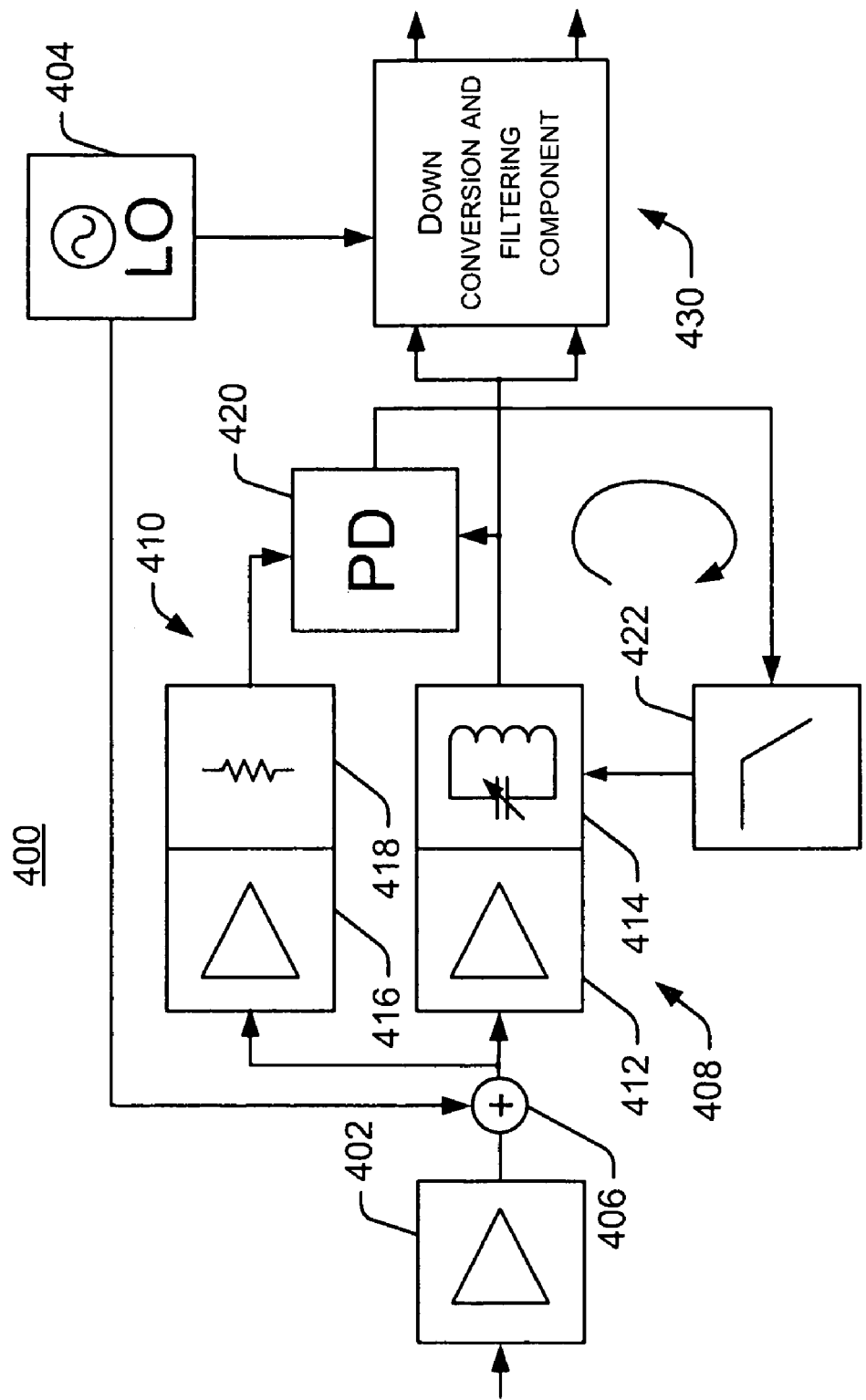
FIG. 4 is a simplified schematic diagram of a system that includes a first circuit including an adjustable filter and a parallel coupled second circuit including a fixed value filter.

FIG. 4 illustrates an alternative implementation of a system 400 for phase locked loop based frequency tuning of an adjustable filter. System 400 includes an amplifier 402 and a local oscillator 404 coupled to adder circuit 406. Alternatively, the adder circuit 406 may be replaced with a switch similar to switch 206. During one time period, signals are received by amplifier 402 (such as RF signals receive from an antenna, which is not shown for the sake of simplicity) and fed via adder circuit 406 to a first circuit 408. The signal is processed by a first circuit 408 and fed to down conversion and filtering component 430. During this period, which may be the normal receiving mode of the system 400 implemented in a wireless device, the output signal from first circuit 408 may be referred to as a filtered signal.

During a different time period, the local oscillator 404 generates and feeds, via the adder circuit 406, an oscillation signal to the first circuit 408 and a second circuit 410. During this period, which may be referred to as a test or calibration period of the system 400, the output of the oscillation signal from first circuit 408 may be referred to as a first output oscillation signal and the output of the oscillation signal from second circuit 410 as a second output oscillation signal. The first circuit 408 includes an amplifier 412 and an adjustable filter 414, which may be a so-called LC tank reactance filter with adjustable impedance. The second circuit 410 may be a replica circuit that is coupled in parallel to the first circuit 408 and may include an amplifier 416 and a resistive load 418 (e.g. a resister) with a fixed impedance.

The first output oscillation signal from the first circuit 408 and the second output oscillation signal from the parallel coupled second circuit 410 are fed to a phase detector 420. The phase detector 420 may include a time to digital converter circuit to detect temporal spacing between two edges and thereby detect a phase difference between the first output oscillation signal from the first circuit 308 and the second output oscillation signal from the second circuit 410.

Phase detector 420 generates a phase difference signal indicating the phase difference between the first output oscillation signal from the first circuit 408 and the second output oscillation signal from the second circuit 410. Phase difference signal also accounts for any phase offset or other characteristic of the amplifier 412 (or circuit 408 generally) by comparing the first output oscillation signal and the second output oscillation signal. The amplifier 416 of the second circuit 410 is similar or identical to the amplifier 412 of the first circuit 408. The resistive load 418 does not produce a phase rotation or offset. Thus, the offset or other characteristics of the amplifier 416 (and, thus, 412) may be monitored by monitoring and comparing the first output oscillation signal from the first circuit 408 and the second output oscillation signal from the parallel coupled second circuit 410.

The phase detector 420 feeds the phase difference signal to a loop filter 422, which may be a low pass filter circuit. The loop filter 422 is connected to the adjustable filter 414 in first circuit 408. The loop filter 422 filters the phase difference signal and generates a tuning signal having an adjustment value corresponding to the phase difference between the output oscillation signal from the first circuit 408 and the output oscillation signal from the second circuit 410. The loop filter 422 sets an adjustable value, such as an adjustable capacitance, impedance or other suitable value, of the adjustable filter 414 based on the adjustment value of the tuning signal. By adjusting the impedance of the adjustable filter 414 in the first circuit 408 such that the phase of the signal from the first circuit 408 matches the phase of the signal from second circuit 410, a phase locked loop is created that adjusts a center frequency of first circuit 408 to the frequency of the local oscillator 404 and that adjusts for any offset caused by the amplifier 412 of the first circuit 408.

The LO signal from local oscillator 404 may be removed from application to the first circuit 408. The adjustment value of the adjustable filter 414 is then stored, such as in an associated memory or logic circuit, which is well understood in the adjustable filter arts and, therefore not shown for the sake of simplicity. The adjustable filter 414 may be operated using the adjustment value once the PLL is opened and/or once an incoming signal is provided through amplifier 402. The incoming signal, such as an RF signal received by an antenna, may be processed by the circuit 408 with the adjustable filter 414 having the fixed adjustment value as set and retained using the tuning signal from loop filter 422. Thus, the first circuit 408 produces a filtered output signal, which is fed to down conversion and filtering component 430. The down conversion and filtering component 430 may be implemented as one or more decoder circuits having a down converter and a low pass filter that decode and filter the filtered output signal from the first circuit 408.

Figure 5:
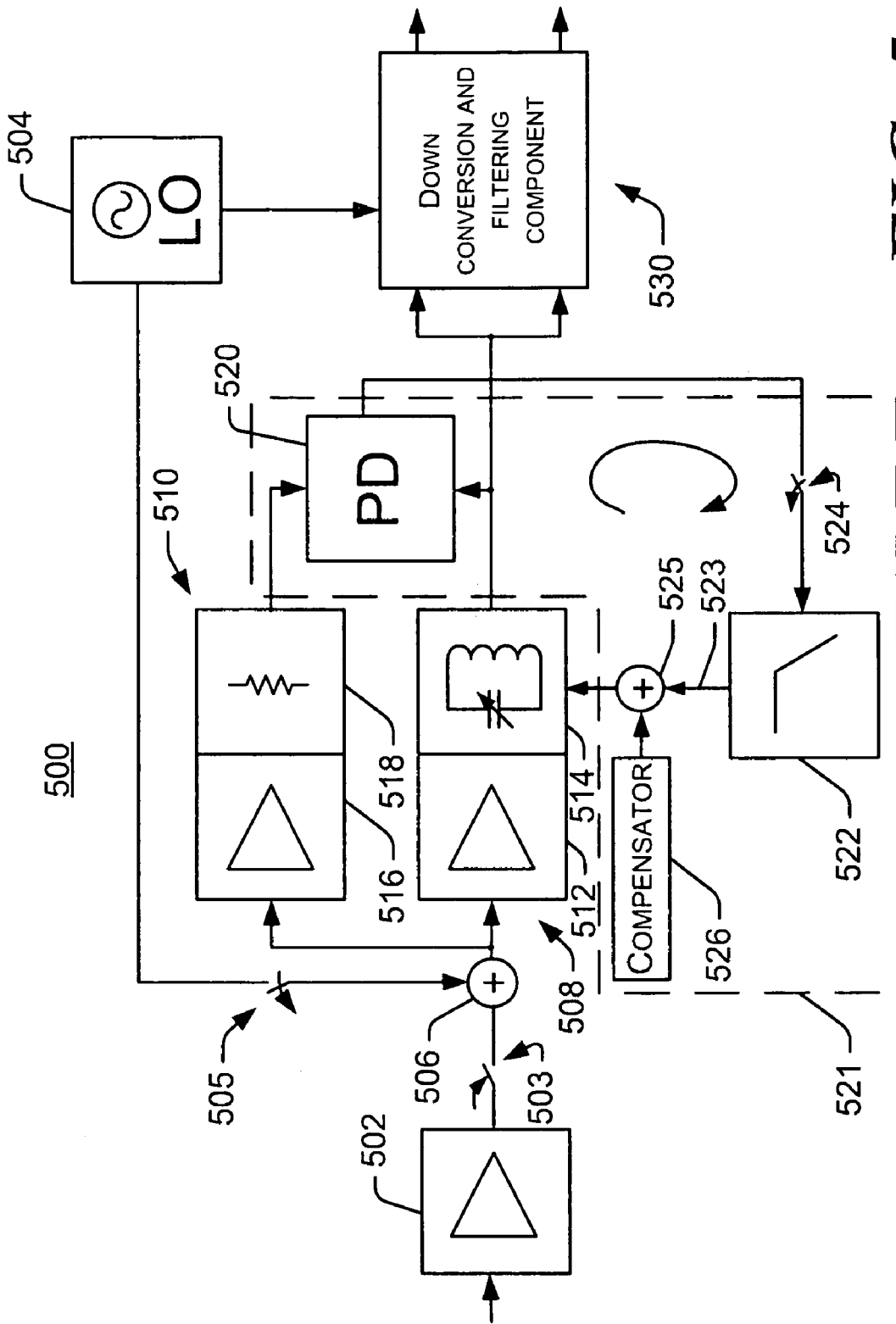
FIG. 5 is a simplified schematic diagram of an alternative system that includes a first circuit including an adjustable filter and a parallel coupled second circuit including a fixed value filter.

FIG. 5 illustrates an alternative implementation of a system 500 for phase locked loop based tuning of an adjustable filter. System 500 includes an amplifier 502 and a local oscillator 504 coupled via switches 503 and 505 and, via adder circuit 506, to a first circuit 508 and a parallel coupled second circuit 510.

During operation, signals, such as RF signals received by an antenna (not shown), are provided to amplifier 502. Switch 503 is closed and switch 505 is opened. The RF signals are fed via switch 503 and adder circuit 506 to both the first circuit 508 and parallel coupled second circuit 510.

During a test or calibration time period, switch 503 is opened and switch 505 is closed. The local oscillator 504 generates an oscillation signal that is fed via switch 505 and adder circuit 506 to both the first circuit 508 and the parallel coupled second circuit 510. The first circuit 508 includes an amplifier 512 and an adjustable filter 514. The parallel coupled second circuit 510 includes an amplifier 516 and a fixed value, or resistive, filter 518 (e.g. a resister) with a fixed impedance.

The output oscillation signals from the first circuit 508 and a parallel coupled second circuit 510 are fed to an adjustment circuit 521. Adjustment circuit 521 sets the adjustable characteristic (e.g., impedance) of the first circuit 508 based on the detected phase difference between the output oscillation signal from the first circuit 508 and the output oscillation signal from the second circuit 510. The adjustment circuit 521 includes a phase detector 520, a loop filter 522, a switch 524, an adder circuit 525, and a compensator 526 and, thus, may form a phase locked loop configuration.

Phase detector 520 may include a time to digital converter circuit to detect a phase difference between an output oscillation signal from the first circuit 508 and an output oscillation signal from the second circuit 510. Phase detector 520 generates a phase difference signal indicating the phase difference between the output oscillation signal from the first circuit 508 and the output oscillation signal from the second circuit 510. Phase detector 520 feeds the phase difference signal to a loop filter 522, such as a low pass filter, via switch 524. The switch 524 is operable to disconnect the phase difference signal from the loop filter, thereby disabling the adjustment circuit 521 from generating a tuning signal based on the detected phase difference.

The loop filter 522 and compensator 526 are connected via adder circuit 525 to the adjustable filter 514 in the first circuit 508. The loop filter 522 filters the phase difference signal and generates a tuning signal on line 523 having an adjustment value corresponding to the phase difference between the output signal from the first circuit 508 and the output signal from the second circuit 510. The loop filter 522 thus provides a signal to set the adjustable value (e.g. impedance, capacitance, etc.) of the first circuit 508 based on the adjustment value of the tuning signal. For example, by adjusting the adjustable filter 514 in the first circuit 508, the center frequency of adjustable filter 508 may be locked to the oscillator frequency of the local oscillator 504. The loop filter 522 may include a register circuit (not shown) to retain the adjustment value when the phase difference signal is disconnected from the loop filter 522.

The compensator 526 (also referred to as a compensation model circuit) may provide a signal to line 523 using adder circuit 525 to periodically change the adjustment value of the tuning signal on line 523. The compensator 526 may be programmed to compensate for modeled temperature drifts of the adjustable filter 514 or other changed operating conditions. The signal provided along 523 may be thus modified at adder circuit 525 before being provided to the adjustable filter 514.

Switch 505 may be opened to disconnect the oscillation signal fed from the local oscillator 504 to the first circuit 508 and the parallel coupled second circuit 510. Also switch 505 may be opened for a predetermined period of time corresponding to a maximum transient recovery time of the first circuit 508.

After the oscillation signal fed from the local oscillator is disconnected from both the first circuit 508 and the parallel coupled second circuit 510, switch 524 may be opened to disconnect the phase difference signal fed to the loop filter 522. At that time, switch 503 may be closed. When switches 524 and 505 are opened, and switch 503 is closed, an incoming signal, such an RF signal, may be received by amplifier 502, and then fed via switch 503 and via adder circuit 506 to the first circuit 508 to be filtered. The filtered output signal from the first circuit 508 is then fed to the down conversion and filtering component 530. The down conversion and filtering component 530 may be configured to receive RF, intermediate frequency, or other similar incoming signal. The down conversion and filtering component 530 receives the oscillation signal from the local oscillator 504 and, using down converters, low pass filters, and/or other known components, processes incoming signals such as those processed by circuit 508.

Alternative Exemplary Process

Specifics of exemplary methods are described below. However, it should be understood that certain acts need not be performed in the order described, and may be modified, and/or may be omitted entirely, depending on the circumstances. Moreover, the acts described may be carried out by a computer, processor or other computing device based on instructions stored on one or more computer-readable media. The computer-readable media can be any available media that can be accessed by a computing device to implement the instructions stored thereon.

Figure 6:
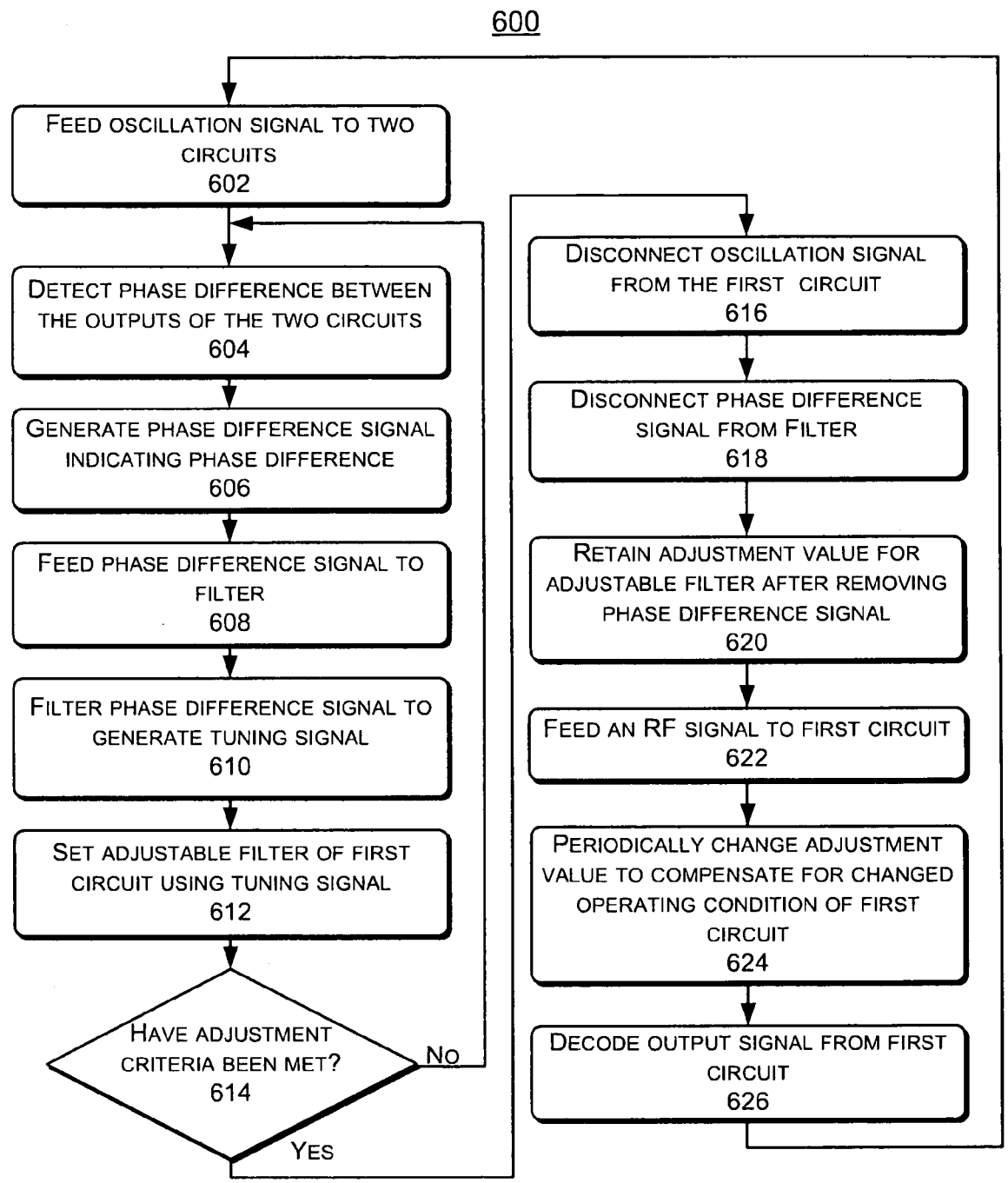
FIG. 6 is a flow diagram of a process for phase locked loop-based tuning of an adjustable filter in a first circuit using a parallel coupled second circuit.

FIG. 6 illustrates one example implementation of a process 600 for phase locked loop based tuning of an adjustable filter 514 using the system 500 shown in FIG. 5.

At 602, switch 503 is opened, and switches 505 and 524 are closed. An oscillation signal is fed from a local oscillator 504 or other oscillation signal source to a first circuit 508 and a parallel coupled second circuit 510. The first circuit 508 includes an amplifier 512 and an adjustable filter 514 with an adjustable characteristic, such as capacitance or impedance. The parallel coupled second circuit 510 includes an amplifier 516 and a fixed value, or resistive, filter 518 having a fixed impedance.

At 604, a phase difference is detected between the output oscillation signal from the first circuit 508 and the output oscillation signal from the second circuit 510.

At 606, a phase difference signal is generated that indicates the phase difference between the output oscillation signal from the first circuit 508 and the output oscillation signal from the second circuit 510.

At 608 the phase difference signal is fed to the loop filter 522 via the closed switch 524.

At 610, the phase difference signal is filtered by the loop filter 522 to generate a tuning signal. The tuning signal is fed to the adjustable filter 514 in the first circuit 508 via adder circuit 525.

At 612, the adjustable characteristic of the adjustable filter 514 in the first circuit 508 is set using the tuning signal. By adjusting the adjustable filter 514 in the first circuit 508, such that the phase of the signal output by the first circuit 508 matches the phase of the signal output by the second circuit 510, the phase locked loop adjusts a center frequency of the circuit 508 based on the frequency of the local oscillator 504.

At 614, it is determined whether one or more criteria have been met. For example, it may be determined whether a certain set point or adjustment value for the adjustable filter 514 has been reached. Alternatively, it may be determined whether a predetermined time has elapsed since the LO signal was initially provided to the circuit 508. If the one or more criteria have not been met, the process returns to 604. If the one or more criteria have been met, the process proceeds to 616.

At 616, the oscillation signal from local oscillator 504 is disconnected from the first circuit 308 and the second circuit 510 by opening switch 505.

At 618, the phase difference signal is disconnected from the loop filter 522 by opening switch 524.

At 620, an adjustment value of the adjustable filter is retained at a fixed value after switch 524 is opened. Thus, the adjustable filter 514 is adjusted or tuned for use in receiving signals, such as RF communication signals and providing them as filtered RF output signals. The filtered RF output signal from the resonance circuit 208 may then be fed to further processing components, such as down converter and filtering components 230, as described above.

At 622, the incoming signal, such as an RF signal received by an antenna, is fed to amplifier 502 and fed via switch 503 and adder circuit 506 to the first circuit 508. The first circuit 508 processes the incoming signal with the adjustable value of the adjustable filter 514 set based upon the retained adjustment value.

At 624, the fixed adjustment value may be periodically modified using compensator 526 and adder circuit 525 to compensate for changed operating conditions, such as temperature drifts, of the adjustable filter 514 and/or the first circuit 508 generally. As mentioned above with regard to FIGS. 4 and 5, such modification may not be necessary and, in that event, this step may be omitted.

At 626, the output signal from the first circuit 508 is down converted and decoded using local oscillator 504 and the down conversion and filtering component 530. After completing block 626, the process may repeat in block 602 by opening switch 503, and closing switches 505 and 524 and thereby repeating the process 600.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. A system comprising:
   a resonant circuit including an amplifier and an adjustable filter;
   a phase locked loop (PLL) circuit incorporating the resonant circuit and configured to adjust the adjustable filter; and
   a local oscillator configured to provide:
   an oscillator signal for use in down converting signals, and
   an input signal into the resonant circuit.

2. The system as recited in claim 1, wherein:
   the PLL circuit comprises a phase detector to detect a phase difference between the signal input into the resonant circuit and a signal output by the resonant circuit, and
   the PLL circuit is configured to adjust the adjustable filter based on the phase difference.

3. The system as recited in claim 2, wherein the PLL circuit further comprises a phase adjustment component to adjust the adjustable filter based on a phase offset characteristic of the amplifier or of the resonant circuit.

4. The system as recited in claim 2, wherein the adjustable filter is adjusted by tuning the adjustable filter to a frequency.

5. The system as recited in claim 2 further comprising setting and storing an adjustment value for the adjustable filter, the adjustable filter configured to operate using the adjustment value.

6. A method comprising:
   detecting a phase difference between a signal input into a circuit by a local oscillator and a signal output by the circuit, the circuit including an amplifier and an adjustable filter;
   generating a phase difference signal that indicates the phase difference between a center frequency of the signal input into the circuit and a center frequency of the signal output by the circuit;
   processing the phase difference signal to provide a tuning signal;
   setting an adjustable characteristic of the adjustable filter using the tuning signal; and
   down converting the signal output by the circuit using the signal input into the circuit by the local oscillator.

7. The method of claim 6, wherein the acts of detecting, generating, processing and setting are performed using a circuit configuration approximating a phase locked loop (PLL).

8. The method of claim 6, wherein processing the phase difference signal comprises:
   adjusting the phase difference signal to accommodate a phase desired value.

9. The method of claim 6 further comprising
   retaining a fixed adjustment value for the adjustable filter after one or more predetermined criteria have been met.

10. The method of claim 9, wherein the one or more predetermined criteria are based upon a predetermined time elapsing after the signal input into the circuit is initially input into the circuit.

11. A method comprising:
   providing an oscillation signal from a local oscillator to a first circuit and to a parallel coupled second circuit, the first circuit including an adjustable filter;
   detecting a phase difference between a first output oscillation signal from the first circuit and a second output oscillation signal from the second circuit;
   generating a phase difference signal indicating the phase difference between the first output oscillation signal and the second output oscillation signal;
   filtering the phase difference signal using a low pass filter to generate a tuning signal having an adjustment value corresponding to the phase difference between the first output oscillation signal and the second output oscillation signal;
   setting the adjustable filter based on the adjustment value of the tuning signal; and
   when one or more predetermined criteria are met, the method further comprises:
   disconnecting the oscillation signal from the first circuit and from the parallel coupled second circuit;
   disconnecting the phase difference signal from the low pass filter; and
   retaining an adjustment value of the adjustable filter at a fixed value after disconnecting the phase difference signal from the low pass filter.

12. The method of claim 11, wherein the one or more predetermined criteria are based upon a predetermined time elapsing after the oscillation signal is initially provided to the first circuit.

13. The method of claim 11 further comprising modifying the adjustment value to compensate for a changed operating condition of the adjustable filter or the first circuit.

14. The method of claim 11 further comprising processing an incoming signal from an antenna using the first circuit, the adjustable filter having a fixed value based upon the retained adjustment value.

15. A system comprising:
   a first circuit including an amplifier and an adjustable filter, the first circuit configured to receive an oscillator signal;
   a second circuit coupled in parallel with the first circuit to receive the oscillator signal, the second circuit including an amplifier and a fixed value filter;
   an adjustment circuit including a phase detector to detect a phase difference between an output oscillation signal from the first circuit and an output oscillation signal from the second circuit, the adjustment circuit configured as a phase locked loop (PLL) to generate a tuning signal to set an adjustment value of the first circuit based on the detected phase difference and to lock a center frequency of the first circuit to a frequency of the oscillator signal;
   a first switch to selectively disconnect the oscillation signal from both the first circuit and the parallel coupled second circuit; and
   a second switch to disconnect and disable the adjustment circuit from generating a tuning signal based on the detected phase difference, wherein the adjustment circuit comprises a register circuit to retain the adjustment value during operation of the adjustable filter of the first circuit.

16. The system according to claim 15, wherein the phase detector comprises a time to digital converter circuit to detect temporal spacing between an edge of the output oscillation signal from the first circuit and an edge of the output oscillation signal from the second circuit.

17. The system according to claim 15,
wherein the first switch is configured to periodically disconnect the oscillation signal for a predetermined period of time corresponding to a maximum transient recovery time of the first circuit.

18. The system according to claim 15 further comprising:
a third switch to connect an RF signal to the first circuit when the first and second switch are disconnected;
a compensator to periodically change the adjustment value to compensate for changed operating conditions of the first circuit; and
a down conversion and filtering component to receive and decode a filtered RF output signal from the first circuit using the oscillation signal.

* * * * *